US011115032B1

(12) United States Patent
Lachhwani et al.

(10) Patent No.: US 11,115,032 B1
(45) Date of Patent: Sep. 7, 2021

(54) PLL SYSTEM AND DEVICE WITH A LOW NOISE CHARGE PUMP

(71) Applicant: Steradian Semiconductors Private Limited, Bengaluru (IN)

(72) Inventors: Ashish Lachhwani, Bengaluru (IN); Gireesh Rajendran, Bengaluru (IN)

(*) Notice: Subject to any disclaimer, the term of this patent is extended or adjusted under 35 U.S.C. 154(b) by 0 days.

(21) Appl. No.: 17/024,701

(22) Filed: Sep. 18, 2020

(51) Int. Cl.
*H03L 7/089* (2006.01)
*H03L 7/107* (2006.01)

(52) U.S. Cl.
CPC .......... *H03L 7/0895* (2013.01); *H03L 7/107* (2013.01)

(58) Field of Classification Search
CPC ... H03L 7/0895; H03L 7/0891; H03L 7/0893; H03L 7/107; H03L 7/102
USPC ......... 327/156, 158, 161; 375/371, 374, 375
See application file for complete search history.

(56) References Cited

U.S. PATENT DOCUMENTS 6,472,915 B1 * 10/2002 Moyal .................. H03L 7/0896
327/157

* cited by examiner

*Primary Examiner* — John W Poos (57) ABSTRACT

According to an aspect, a phase locked loop system comprises a charge pump (CP) comprising a set of switching transistors and a set of non-switching transistor, in that the set of switching transistors operative at a low break down voltage and a high switching speed compared to that of the set of non-switching transistors, and comparative a voltage comprising a configured to generate a UP pulse when a first plurality of metal strips forming a first part of a closed contour enclosing a first area, and a phase frequency detector (PFD) providing a UP pulse swinging between a VDDL and a VDDH, wherein the PFD is interfaced with the CP such that, the UP pulse drives a first switching transistor in the CP to couple the VDDH to an output terminal through a first non-switching transistor that is biased for charge pump.

13 Claims, 8 Drawing Sheets

PLL SYSTEM AND DEVICE WITH A LOW NOISE CHARGE PUMP

CROSS REFERENCES TO RELATED APPLICATIONS

This application claims priority from Indian patent application No.: 202041029768 filed on Jul. 13, 2020 which is incorporated herein in its entirety by reference.

BACKGROUND

Technical Field

Embodiments of the present disclosure relate generally to electronic systems more specifically to a phased locked loop (PLL) system and device with a low noise charge pump.

Related Art

PLL is referred to a system operative to match phase and/or frequency of a reference signal (a first signal) and a feedback signal (a second signal) as is well known in the art. The PLL is employed for in a communication system, radar system, object detection system, and other electronic systems for clock detection, reference clock/frequency generation, frequency conversion, modulation and demodulation of a signal, for example.

The PLL system generally employ a phase frequency detector (PFD), a charge pump (CP) and a loop filter (LP) and a voltage controlled oscillator (VCO) to match the frequency/phase (hereafter used interchangeably). In principal, the frequency of the VCO is altered to achieve the match/lock (as in the phase locked look).

In operation, the PFD detects a phase difference between the reference signal and the feedback signal to generate one of an UP, DOWN and a RESET signal (hereafter referred to as PFD output) representing the phase difference. The PFD output signal is provided to the CP for altering the voltage to the VCO. Often, the switching time of PFD and the voltage range of CP are compromised against one another, thus rendering the PLL operation less efficient at least for deployment in radar systems operative to perform object detection and mapping.

SUMMARY

According to an aspect of the present disclosure a phase locked loop system comprises a phase frequency detector (PFD) providing a shifted UP pulse swinging between a first low voltage and a first high voltage, and a charge pump (CP) comprising a set of switching transistors and a set of constant gate bias transistors, in that the set of switching transistors are rated with a first breakdown voltage and a first switching speed, and the set of constant gate bias transistors are rated at a second breakdown voltage and a second switching speed, in that, the first breakdown voltage is substantially half the second breakdown voltage and the first switching speed is greater than the second switching speed, wherein the PFD is coupled to the CP such that, the shifted UP pulse drives a first switching transistors in the set of switching transistors to provide a high voltage capable signal at an output terminal through a first constant bias transistor, in the set of constant gate bias transistors, that is biased for charge pump.

According to another aspect, in the phase locked loop system, the PFD comprising a level shifter shifting an UP pulse to provide the shifted UP pulse, in that the UP pulse swings between a second low voltage to second high voltage wherein the first low voltage is substantially equal to the second high voltage, the first high voltage is substantially equal to twice the second high voltage and second low voltage is substantially zero.

According to yet another aspect, the phase locked loop system further comprising a second switching transistor in the set of switching transistors, coupled to the first switching transistor such that the second switching transistor couples a first bias voltage to one of a drain and a source terminal while the other terminal is coupled to a voltage higher than the first breakdown voltage to maintaining corresponding drain to source voltage of the first switching transistor within the first breakdown voltage when the first switching transistor is in OFF state.

In yet another aspect, in the phase locked loop system the first switching transistor and the second switching transistors are respectively driven by the shifted UP pulse and its compliment such that the second switching transistor is turned OFF when the first switching transistor is ON and vice-e-versa.

Several aspects are described below, with reference to diagrams. It should be understood that numerous specific details, relationships, and methods are set forth to provide a full understanding of the present disclosure. One who skilled in the relevant art, however, will readily recognize that the present disclosure may be practiced without one or more of the specific details, or with other methods, etc. In other instances, well-known structures or operations are not shown in detail to avoid obscuring the features of the present disclosure.

DETAILED DESCRIPTION OF THE PREFERRED EXAMPLES

Figure 1:
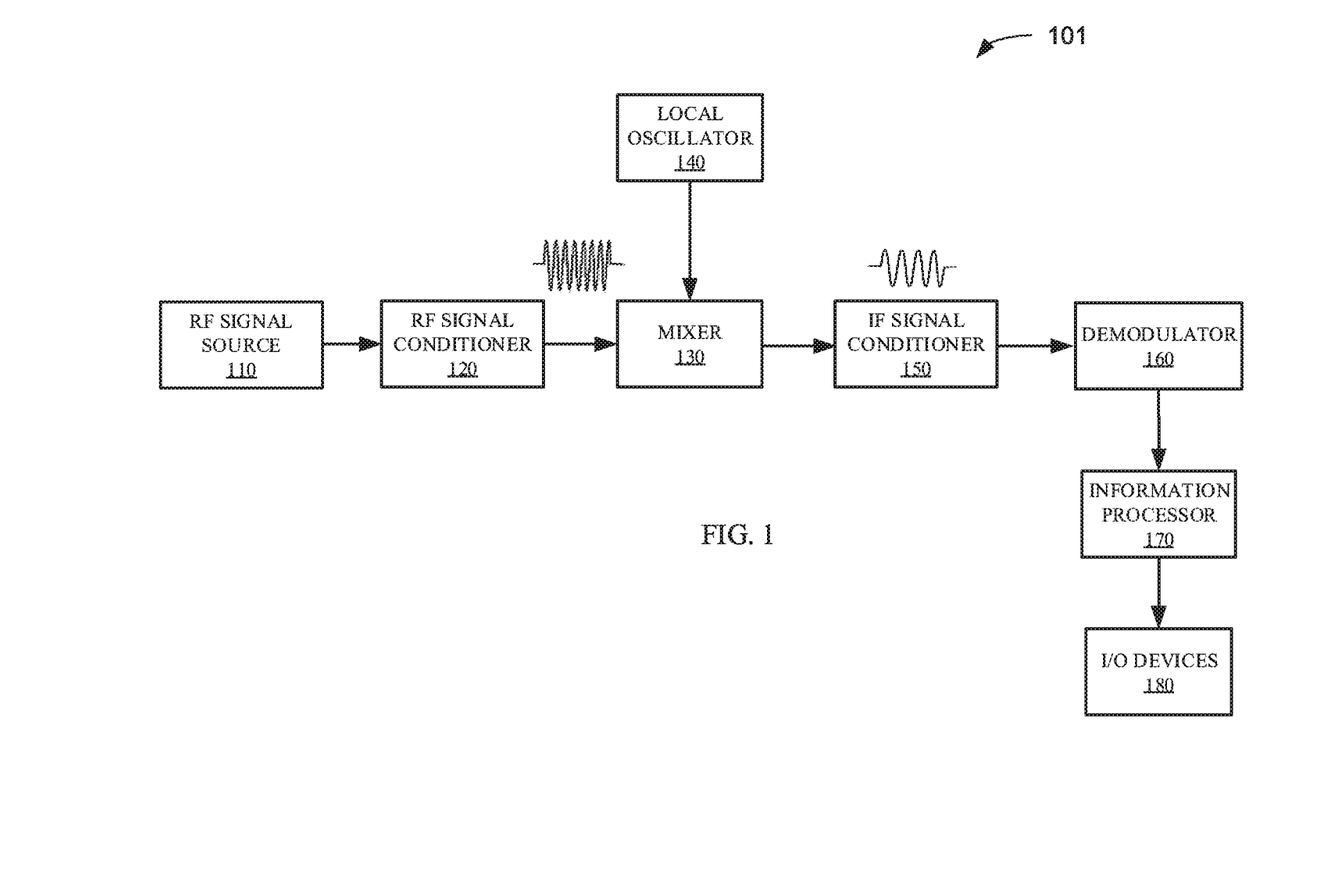
FIG. 1 is an example block diagram of a radar receiver system in which various aspect of the present disclosure may be seen.

FIG. 1 is an example block diagram of a radar receiver system in which various aspect of the present disclosure may be seen. As shown the example radar receiver system 101 may comprise, RF (Radio Frequency) signal source 110, RF signal conditioner block 120, Mixer 130, Local oscillator 140, an IF signal conditioner 150, Demodulator 160, Information processor 170 and I/O device 180. Each element of the radar receiver system is described in further detail below.

The RF signal source 110 represents the Radar signal received from the object (for example reflected signal) on one or more receiving antenna operating independently or in the MIMO configuration. The radar signal may comprise the signal separated in time and/or in frequency centered at a high frequency (carrier frequency) as is well known in the art. RF signal source 110 may comprise any other Radar signal adapted for different applications such as object detection, geo mapping, etc. The RF signal source 110 may also comprise any other signal transmitted by a communication system over a communication channel. The signal from the RF signal source 110 may be provided to RF signal conditioner 120.

The RF signal conditioner 120 conditions the RF signal for processing. The RF signal conditioner 120 may comprise at least one of a: low noise RF amplifier which provides initial gain and selectivity, RF frequency filter that may eliminate the noise, load balancing circuits etc. RF amplifiers may be implemented using a Bipolar and field effect transistors, or Integrated circuits (IC's), or similar kind. This block outputs desired frequency bands and these conditioned signal is provided to the mixer 130.

The mixer 130 receives the conditioned signal from the RF signal conditioner 120 and performs mixing operation with the reference signals. In one embodiment the mixer may be employed as part of the range detection, object detection etc. The Mixer 130 may provide output that may be the sum and/or difference frequencies of input signal and reference local oscillator signal. The mixer converts RF signal into IF (Intermediate Frequency) signal.

The local oscillator 140 provides a reference signal/frequency to the mixer 130 for mixing operation. In one embodiment the local oscillator excites a frequency for mixing with the incoming RF signal to get the intermediate frequency. The local oscillator 140 may provide one or more reference signal for mixing operation. The frequency of the reference signal (reference frequency) may comprise signal of Megahertz and/or Gigahertz.

The IF signal conditioner 150 receives an IF signal from mixer 130 for processing. IF signal conditioner 150 may perform amplification, filtering and other signal conditioning operations. The filter operation may comprise eliminating frequency other than the ones that are centered at one or more IF frequencies.

The demodulator (or detector) 160 extracts information from the IF signal received from the IF signal conditioner. For example, operations of the demodulator may comprise extraction of range information, azimuth and/or elevation angle of the object etc. The demodulator may also perform extraction of audio and/or video information from the IF signals. The demodulator 160 may be implemented in any known ways for extraction of the respective information.

The Information processor 170 receives the information from the demodulator and performs the one or more action on the information. For example, the range, azimuth and elevation angels received from the demodulator 160 are employed to construct 3d/2d object shape and position, terrain mapping etc. In an alternative embodiment, the information processor may perform image processing and audio processing to generate the video and audio for playing and storing, for example.

The I/O device 180 operates to provide interface such as display, speaker, navigation controller, and transceiver. Accordingly, the information processed by the information processor 170 is provided to the I/O device for control and display as may be the case. For example, the position, shape and range information may be provided to navigation control unit (not shown) to avoid collision in an unmanned vehicle navigation system.

In the radar receiver system 101, local oscillator 140 and demodulator 160, for example, employ PLL system for generating stable local reference frequency signals, as frequency synthesizer to detect objects from the received radar signals. In particular, the radar receiver may employ a fractional and/or integer PLL for synthesizing a desired frequency. In case of a fractional PLL, a sigma delta modulator (SDM) is employed to provide an average division of frequency that is a fraction as is well known in the art. In one embodiment, the receiver system 101 operate at 60 Ghz range and/or millimeter wave signals for detecting objects and shape for navigation.

The performance of the conventional PLL system may affect the performance of the receiver system 101 at least in terms of accuracy in determining the range, Azimuth, elevation angle. Further, the performance of the conventional PLL system may perturb the reference frequency(ies) of the local oscillator 140, frequency synthesizers in the demodulator 160, for example, thereby affecting the range, azimuth and elevation.

Accordingly, in one embodiment, the radar receiver system 101 employs the PLL system and device with a low noise charge pump that at least overcome some of the disadvantages noted with the conventional PLL system, thereby providing enhanced efficiency/accuracy in the radar system 101. The manner in which the PLL system may be implemented to provide the enhanced signal to noise ratio with a fast switching time in the radar receiver system 101 is further described below.

Figure 2:
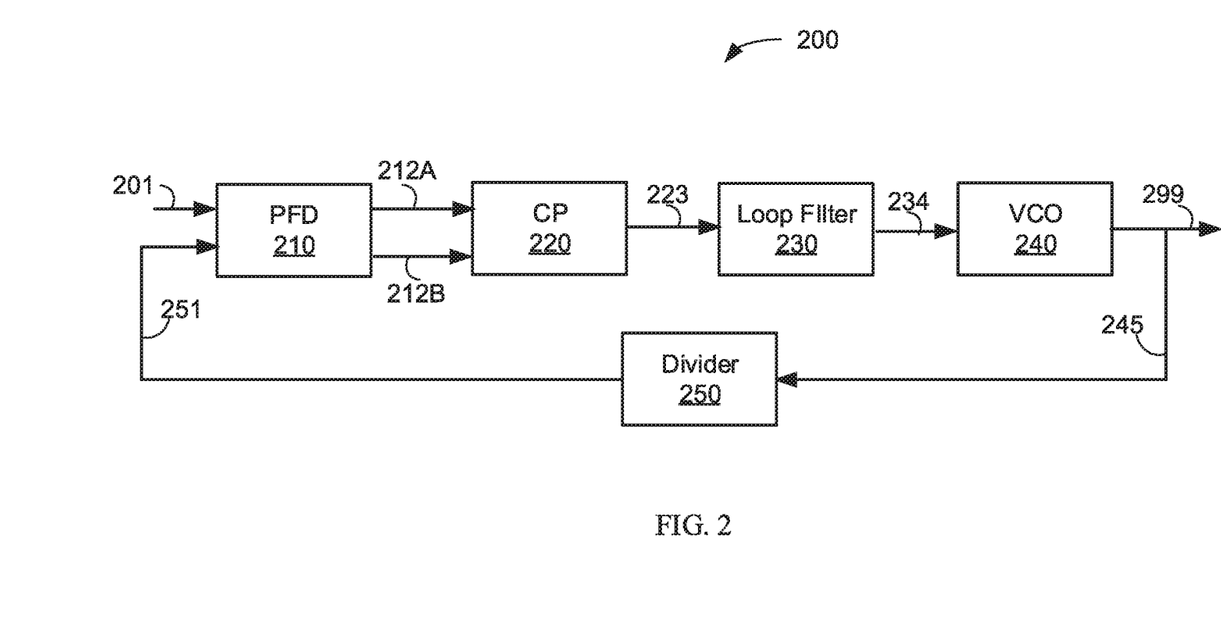
FIG. 2 is an example PLL system in an embodiment.

FIG. 2 is an example PLL system in an embodiment. The PLL system 200 is shown comprising a Phase frequency detector (PFD) 210, a charge pump (CP) 220, a loop filter (LP) 230, a voltage controlled oscillator (VCO) 240 and divider 250. Each element of the PLL system 200 is further described below.

The phase frequency detector (PFD) 210 generates error signal representing the phase and/or frequency difference between the signal on path 201 (reference signal, for example) and the signal on path 251 (feedback signal, for example). The signal on the path 251 may be same as VCO 240 output or divided by a fraction or integer from the divider (250) that divides (by integer or fraction) the signal generated by VCO 240 by its frequency. In case of fraction divider, a sigma delta modulator (SDM, not shown) drives the divider to achieve the division by a fraction. The VCO 240, divider, and the SDM may be implemented in any known way.

In one embodiment, the PFD 210 generates an UP pulse (212A) when the rising edge of the reference signal on path 201 arrives. The PFD 210 generates a DOWN pulse (212B) when the rising edge of the signal on path 251 arrives. The PFD 210 resets the UP and the DOWN pulse on reception of the rising edge of the other signal 201 and 251 respectively (in other words, when rising edge of both 201 and 251 are received).

The charge pump (CP) 220 sources and sinks a constant current to and from the loop filter 230 corresponding (for the duration of) to the UP and Down pulse respectively. The sourcing current increases and sinking current reduces a voltage at the input (223) of the loop filter 230. The loop filter removes the undesired frequency components from the varying voltage (signal) on path 223 and the filtered voltage signal is provided to VCO 240 on path 234. In an embodiment the loop filter 230 is implemented as a low pass filter. The voltage controlled oscillator (VCO) 240 provides a signal on path (299, 245). The PLL 200 operate such that, the frequency/phase of the signal on path 234/299 is in lock with Reference signal (201).

It may be appreciated that, it is desirous that the voltage provided to loop filter accurately represent the phase mismatch detected by the PFD. However, in a conventional implementation, number of factors/elements contributes error (or noise) to the signal presented to loop filter. As is well known, in a conventional PLL implementation, there will be a delay between the arrival of rising edge of both signals (201, 241) and the generation of reset. This is due to the finite speed of logic gates used to generate the reset signal. During this finite reset delay duration the equivalent signal of the CP is zero since both up and down pulse are active. As is known, the intrinsic noise of the signal or charge sources used to implement the CP will inject noise at the output when the UP or Down signals are active. During this reset duration the output of CP will have noise from both UP and Down components while the signal content is zero, resulting in a zero signal to noise ratio (SNR) phase of operation. It is necessary to reduce the duration of this zero SNR phase by reducing the reset delay for improving PLL noise performance.

For a given noise content at the node 223, signal to noise ratio can be improved by allowing higher signal swing, as is well known in the art. This is achieved by employing higher supply voltage for the charge pump and correspondingly implementing the charge pump with thick gate oxide transistors (high voltage rating). Such implementation of CP require the PFD to be implemented with a similar rating transistors resulting in increased reset pulse width (as the higher voltage rating transistors exhibit higher switching time and correspondingly increased gate delay). As an alternative, another conventional technique employs a level shifter that is inserted between PFD with low voltage transistors and CP with high voltage transistors. However, in such implementation the level shifter between PFD and CP introduces noise as it require both set and reset phase to be fast switching.

In one embodiment, the PFD 210 and CP 220 together operate to provide high signal to noise ratio on path 223, in that, the CP 220 employ high voltage source to provide high signal swing and the PFD operate with low voltage device to attain the high switching speed. Thus, in combination, both higher signal swing and reduction in the reset pulse width (or dead zone) are attained. The manner in which the PFD 210 and CP 220 are implemented in an embodiment is further described below.

Figure 3:
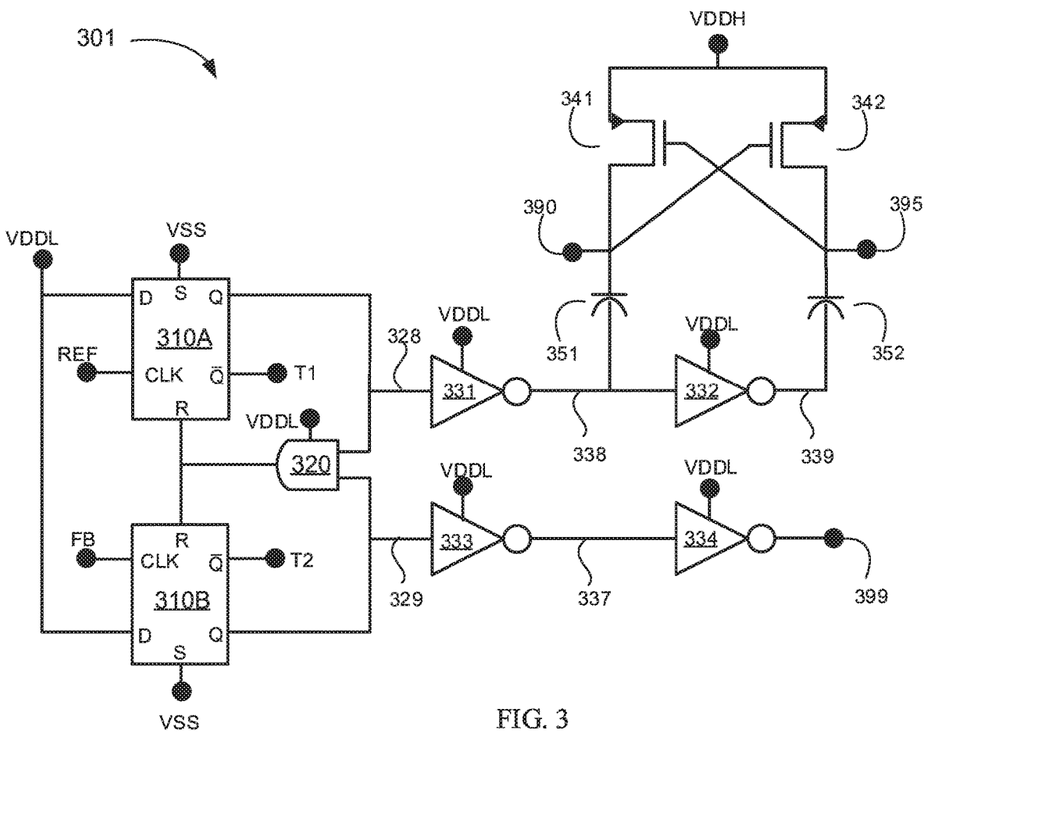
FIG. 3 is a circuit diagram illustrating an example PFD 210 in an embodiment.

FIG. 3 is a circuit diagram illustrating an example PFD 210 in an embodiment. The PFD 301 is shown comprising D flip-flops 310A and 310B, AND gate 320, inverters 331-334, transistors 341 and 342, capacitors 351 and 352. The operation and connections are explained in further detail below.

The D flip-flops 310A and 310B together with the AND gate 320, operate to compare the phase of the signal received on terminal REF and FB. In that, the D flip-flop 310A generates a UP pulse on path 328 when the rising edge of a signal provided on the terminal REF is received. Similarly, the D flip-flop 310B generates a DOWN pulse on path 329 when the rising edge of another signal provided on the terminal FB is received. The UP or DOWN pulse on path 328 and 329 is reset through the AND gate 220 when both the rising edges are received on the REF and FB terminal. The inverters 333, and 334 operate to provide delayed DOWN and DOWN_BAR (Inverted DOWN pulse) on terminal 399 and path 337 respectively. Similarly, the inverters 331, and 332 operate to provide delayed UP and UP_BAR (Inverted UP pulse) on path 339 and 338 respectively.

In the circuit 301 the VDDL represents the low supply voltage (at the drain terminal) and VSS representing the voltage at the source terminal. Accordingly, the D flip-flops 310 A&B, inverters 331-334, and AND gate 320 operate at low voltage (VDDL) and employ fast switching devices/transistors (as is well known, the constructional benefits due to low voltage enable fast switching). Transistors 341 & 342 and capacitors 351 and 352 operate to shift the UP and UP_BAR signal at 339 and 338 to higher voltage level. For example, the signal UP on path 339 swings between zero and VDDL and the UP_BAR on path 338 swing correspondingly between VDDL and zero.

The transistors 341 & 342 and capacitors 351 and 352 configured as shown provides a shifted UP signal on terminal 390 that swing between VDDL and VDDH, and provides the shifted UP_BAR on terminal 395 that swing between VDDH and VDDL. Therefore, in one embodiment the PFD 301 provide UP signal on terminal 390 swinging between VDDL and VDDH, and a DOWN signal on terminal 399 that swing between Zero and VDDL. In one embodiment, the signal on path 337 and on terminal 390, 395 and 399 are provided to the CP 220.

It may be seen that, the voltage level at the drain terminals of the transistors 341 and 342 are maintained at either at VDDL (when transistors are off) or at VDDH (when transistors are on). Thus, the transistors drain to source voltage does not exceed VDDL (typically when VDDH is twice the VDDL). Thus, transistors 341 and 342 are low breakdown voltage transistors with higher switching speed. In other words, though VDDH is employed, the transistors do not experience the high drain to source voltage thus not requiring employing transistors with higher breakdown voltage compromising the switching speed.

Accordingly, the PFD 301 employs low voltage rating transistors for generating UP and DOWN signal to drive the CP 220. As a result, the PFD 301 enables reduction of reset delay by not having to compromise on the maximum attainable switching speed for the lowest operable voltage range. The manner in which the CP 220 may be implemented such that, the higher voltage swing attained without compromising on the switching speed is further described below.

Figure 4:
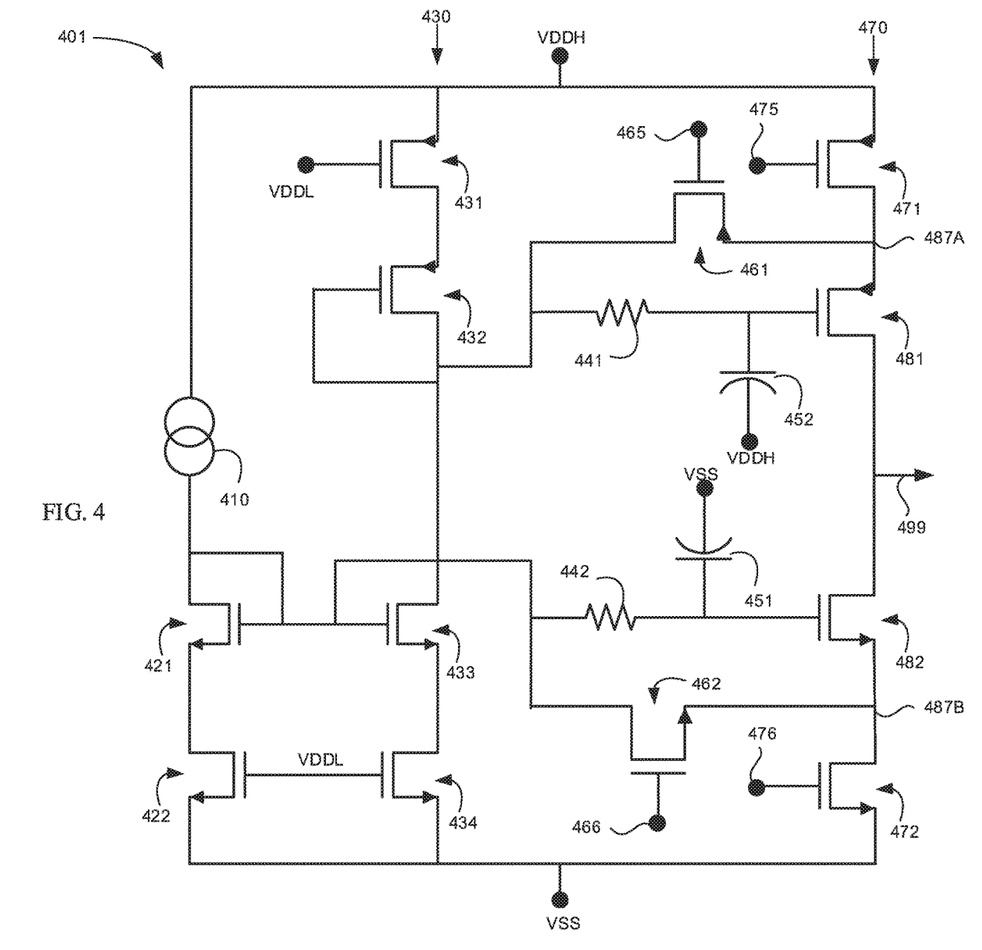
FIG. 4 is a block diagram illustrating a charge pump in an embodiment.

FIG. 4 is a block diagram illustrating a charge pump in an embodiment. The CP 401 is shown comprising elements current source 410, resistors 441 and 442, capacitors 451 and 452, the constant gate bias transistors 421, 422, 431-434, 481 and 482, and the switching gate voltage transistors (also referred to as switching transistors) 461, 462, 471 and 472. The elements are interconnected as shown in the FIG. 4. The CP 401 is described in further detail below.

In one embodiment, constant gate bias transistors 421, 432, 433, 481 and 482 are of high breakdown voltage transistors (for example, VDDH) and participate in providing desired high voltage charge pump at the output terminal 499 (corresponding to terminal 223 in FIG. 2). The switching transistors 461, 462, 471 and 472 are of low breakdown voltage transistors having an ability to operate at high switching speed. The constant gate bias transistors 422 (and 434) and 431 are of type low voltage, used to replicate the state of 472 and 471 in ON state.

In one embodiment, the PFD 301 and the CP 401 are configured to operate in conjunction. Accordingly, the terminal 390 (shifted UP signal) is coupled to the terminal 475, the terminal 395 (shifted UP_BAR) is coupled to terminal 465, the terminal 399 (DOWN) is coupled to the terminal 476 and the path 337 (DOWN_BAR) is coupled to terminal 466. Thus, when the transistor 471 is ON, the transistor 461 is OFF and vice-e-versa. Similarly, when the transistor 472 is ON, the transistor 462 is OFF and vice-e-versa. Thus, the PFD 301 drives the low breakdown voltage and high speed transistors of the CP 401.

In operation, the current source 410 together with the non-switching transistors 421, 422, and 431-434 configured as shown, mirror the current 410 on to the arm 430 with the current ratio in relation to the size ratio of the transistors. The non-switching transistors 432, together with resistor 441 and capacitor 452 configured as shown, provide a gate bias (say Vgp) to the constant gate bias transistor 481, designed to be within VDDL volts of VDDH. Similarly, the constant gate bias transistors 421, together with resistor 442 and capacitor 451 configured as shown, provide a gate bias (say Vgn) to the constant gate bias transistor 482 designed to be less than VDDL.

When the switching transistor 461 is turned on, a voltage close to Vgp is maintained at the terminal 487A. Accordingly, the transistor 471 experiences a maximum drain to source voltage less than VDDL (i.e. VDDH-Vgp) when transistor 471 is off. When the shifted UP signal on the terminal 390 drives the transistor 471 to ON state and couples VDDH to the terminal 487A resulting in a current signal to be produced from 481 to 499 that is equal in magnitude to the current in 432 multiplied by the ratio of the size of 481 to 432. Similarly, when the switching transistor 462 is turned on, a voltage Vgn is maintained at the terminal 487B. Accordingly, the transistor 472 experiences a maximum source to drain voltage less than VDDL when transistor 472 is off. Thus, DOWN signal on the terminal 399 drives the transistor 472 to ON state and couples VSS to the terminal 487B resulting in a current signal to be produced from 482 to 499 that is equal in magnitude to the current in 433 multiplied by the ratio of the size of 482 to 433.

Operating in Conjunction, when PFD 301 provides an UP Pulse on path 328 and correspondingly shifted UP on terminal 390 and shifted UP_BAR on terminal 395, the signal drives the transistor 471 to ON state, transistor 461 to OFF state and enables a signal current from high voltage capable 481 to the output terminal 499. The charge pump 401 sources the current to the loop filter via transistor 471 and 481 and through terminal 499. The transistor 481 configured with the larger metal oxide channel width with the capacity to handle higher voltage swing at 499 improves the signal to noise ratio on the terminal 499.

Similarly, when PFD 301 provides a DOWN Pulse on path 399 and correspondingly DOWN_BAR terminal 339, the signal drives the transistor 472 to ON state, transistor 462 to OFF state and enables a signal current from high voltage capable 482 to the output terminal 499. The charge pump 401 sinks the current from the loop filter via transistor 472 and 482 and through terminal 499. The transistor 482 configured with the larger metal oxide channel width with the capacity to handle higher voltage swing at 499 improves the signal to noise ratio on the terminal 499.

When the PFD resets the UP/DOWN pulse, the corresponding transistors pairs (471, 461) and (472, 462) are mutually turned OFF and ON. For example, when the transistor 471 is turned OFF by reset of UP Pulse, the transistor 461 is turned ON maintaining a voltage less than VDDL across the drain-source nodes of 471.

Accordingly, it may appreciated that, all switching transistors in the PFD 301 & CP 401 and the interface thereto are implemented with low voltage high speed transistors to reduce the Reset delay and charge pump bias transistors are implemented with high voltage transistors. Both high switching speed and high voltage swings are attained in the PFD and CP disclosed in the above paragraph. Accordingly, signal to noise ratio of the radar receiver 101 is enhanced. In one embodiment, in the PFD 301, and CP 401, the VDDL is set to 0.9 Volts, VDDH is set to 1.8 volts and VSS is set to ground potential (zero volts). The resistors are set to 1K Ohms and capacitors are set to 10's of Pico Farads in the CP 401 and 10's of Pico Farads in the PFD 301.

Figure 5:
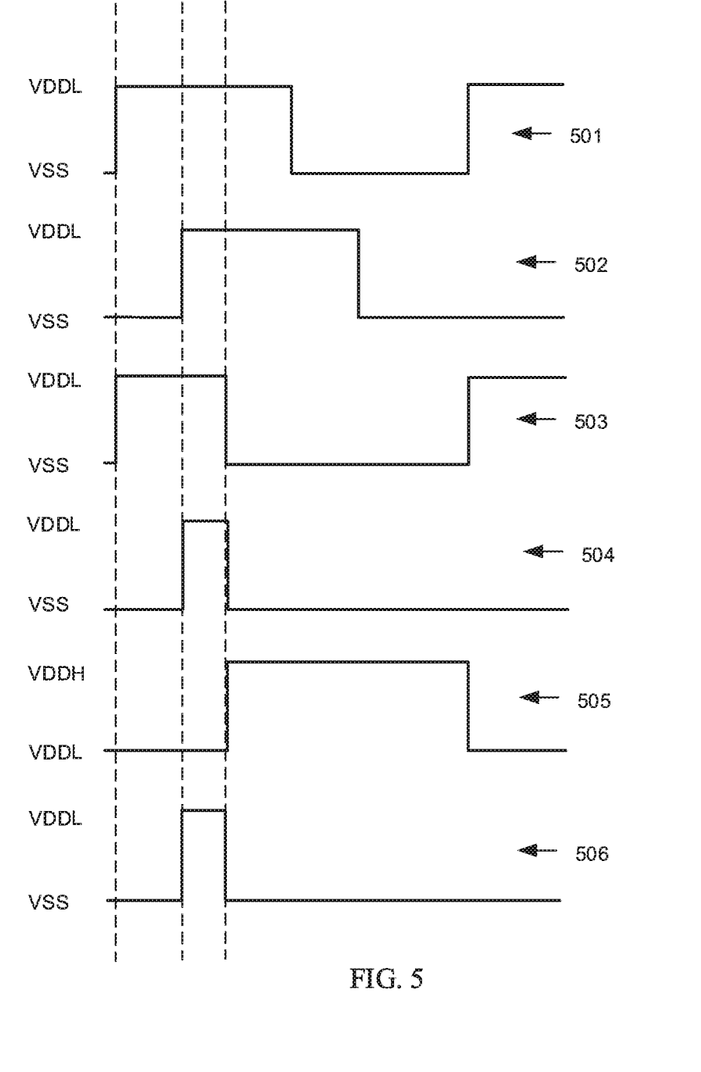
FIG. 5 illustrates an example signal levels at different terminal of PFD 301 and CP 401.

FIG. 5 illustrates an example signal levels at different terminal of PFD 301 and CP 401. In that, the curve 501 representing example signal on terminal REF, the curve 502 representing example signal on FB terminal, curve 503 representing signal on path 328 and curve 504 representing signal on path 329, curve 505 representing signal on path 390 and curve 506 representing signal on path 399.

In one embodiment, the PLL 200 is configured to operate with varying bandwidth (loop bandwidth, as is well known) and the corresponding phase offset. For example, the radar receiver 101 may operate as continuous wave frequency modulated (CWFM) radar. In that, a varying frequency radar signal (Chirp, as is well known in the art) is transmitted and received, the chirp is characterized by the frequency change and the time window during which the change happens, together classified as modulation rate. Accordingly, the PLL 200 is required to be operated with varying loop bandwidth corresponding to the varying frequency modulation rate. Accordingly in one embodiment, the loop bandwidth of the PLL is varied in conjunction with the chirp signal modulation rate. In one embodiment, the required loop bandwidth (proportional to the inverse of the time taken by the PLL to respond to a change) is increased by driving multiple charge pumps for fast response time.

Figure 6:
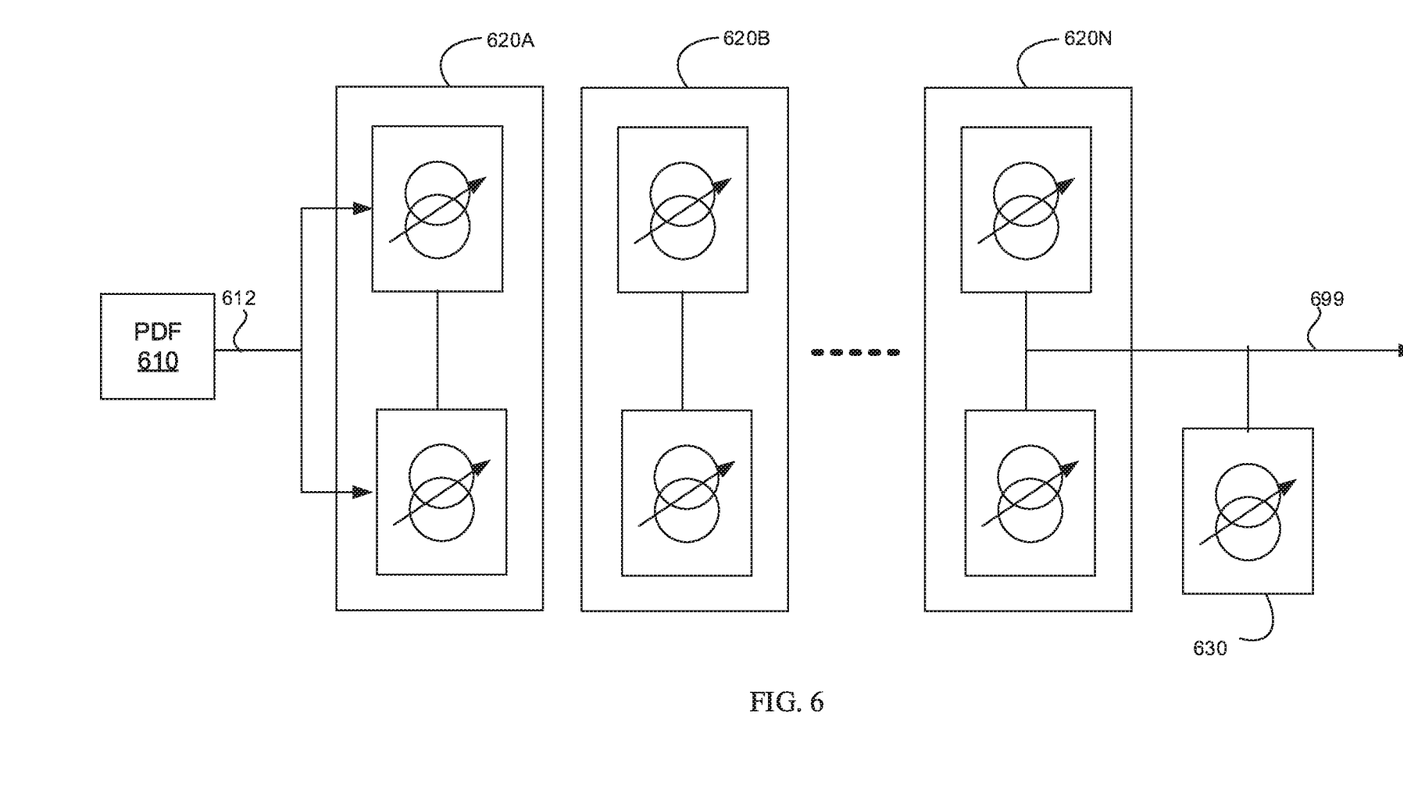
FIG. 6 is a block diagram illustrating multiple charge pumps coupled to the PFD for varying loop bandwidth in one embodiment.

FIG. 6 is a block diagram illustrating multiple charge pumps coupled to the PFD for varying loop bandwidth in one embodiment. The block diagram is shown comprising PFD 610, charge pumps 620A through 620N, and a phase offset compensator (POC) 630. Each element is further described below.

The PFD 610 provide UP and Down pulse representing phase/frequency error between a reference signal and feedback signal. In one embodiment, the PFD 610 operates similar to and/or employing one or more features described with reference the PFD 210 & 301 and descriptions of FIG. 5.

The charge pumps 620A through 620N provide charging and discharging current on path 699 (to the loop filter 230). In one embodiment, the PFD 610 may adaptively drive a selected numbers of charge pumps within 620A through 620N based on the loop bandwidth required. In one embodiment, the charge pump 620A through 620N may be implemented as the arm 470 of charge pump 401. For example, the arm 470 may be repeated N number of times respectively coupling its gate parts to the UP, and DOWN pulses as illustrated in the FIG. 4.

In an alternative embodiment, each charge pump 620A through 620N may be implemented as/similar to charge pump 401. In that, the output terminal 499 of all the charge pumps may be coupled together to form the output terminal 699. As a result, when the loop bandwidth required is high, more numbers of charge pumps are operated by the PFD 610. Accordingly, in case of FMCW radar, number of charge pumps may be dynamically increased or decreased to meet the loop bandwidth requirement. In another embodiment, a bandwidth switching signal may dynamically couple first set of charge pumps and second set of charge pumps to the PFD based on the FMCW signal.

The POC 630 provides an offset current on path 699 to provide phase offset correction to overcome the phase error due to bandwidth change. Further, the POC 630 may be operated with the bandwidth switching signal to turn ON and OFF the offset current ($I_{offset}$). The signal on path 699 is provided to the LPF 230 for filtering.

Figure 7:
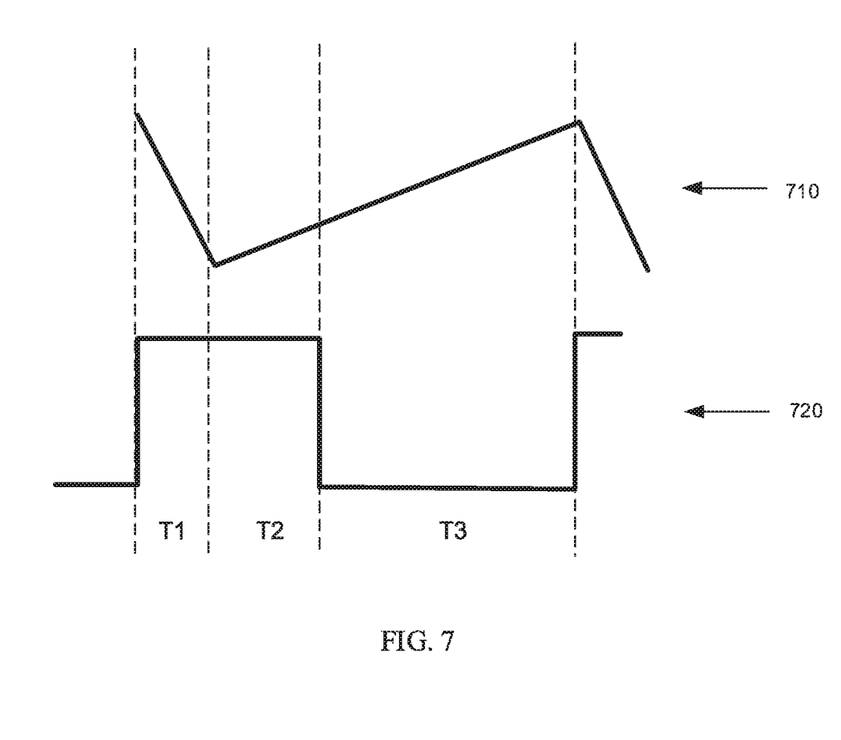
FIG. 7 is an example FMCW signal and the bandwidth switching signal in an embodiment

FIG. 7 is an example FMCW signal 710 and the bandwidth switching signal 720 in an embodiment. As shown there, the FMCW signal 710 is shown comprising fast downwards frequency sweep T1 and chirp sweep T2+T3. In that, the fast downwards frequency sweep T1 may require PLL to operate with the high loop bandwidth compared to the chirp sweep T2+T3. While T2 is set aside for settling time, the T3 is effective chirp time. Accordingly, the logic high (T1 and T2) operate the PFD 610 and charge pumps 620A-N in the high band width mode and the logic low (T3) operates the PFD 610 and charge pumps 620A-N in the low bandwidth mode.

Similarly, the logic high of 720 operates the POC 630 to generate $I_{offset}$ current and logic low of 720 turns off the POC 630. In one embodiment, at low bandwidth the charge pump current is provided is $I_{cp}$ and at high bandwidth the charge pump current provided is equal to ($N*I_{cp}$) where N is an integer greater than one. The $I_{offset}$ is set to a value equal to: $((T_d-T_d/N)/T_{refclk})*N*I_{cp}$. In that, $T_d$ represents the delay between the reference signal and the feedback signal in low bandwidth mode and $T_{refclk}$ representing time period of the reference clock.

Figure 8:
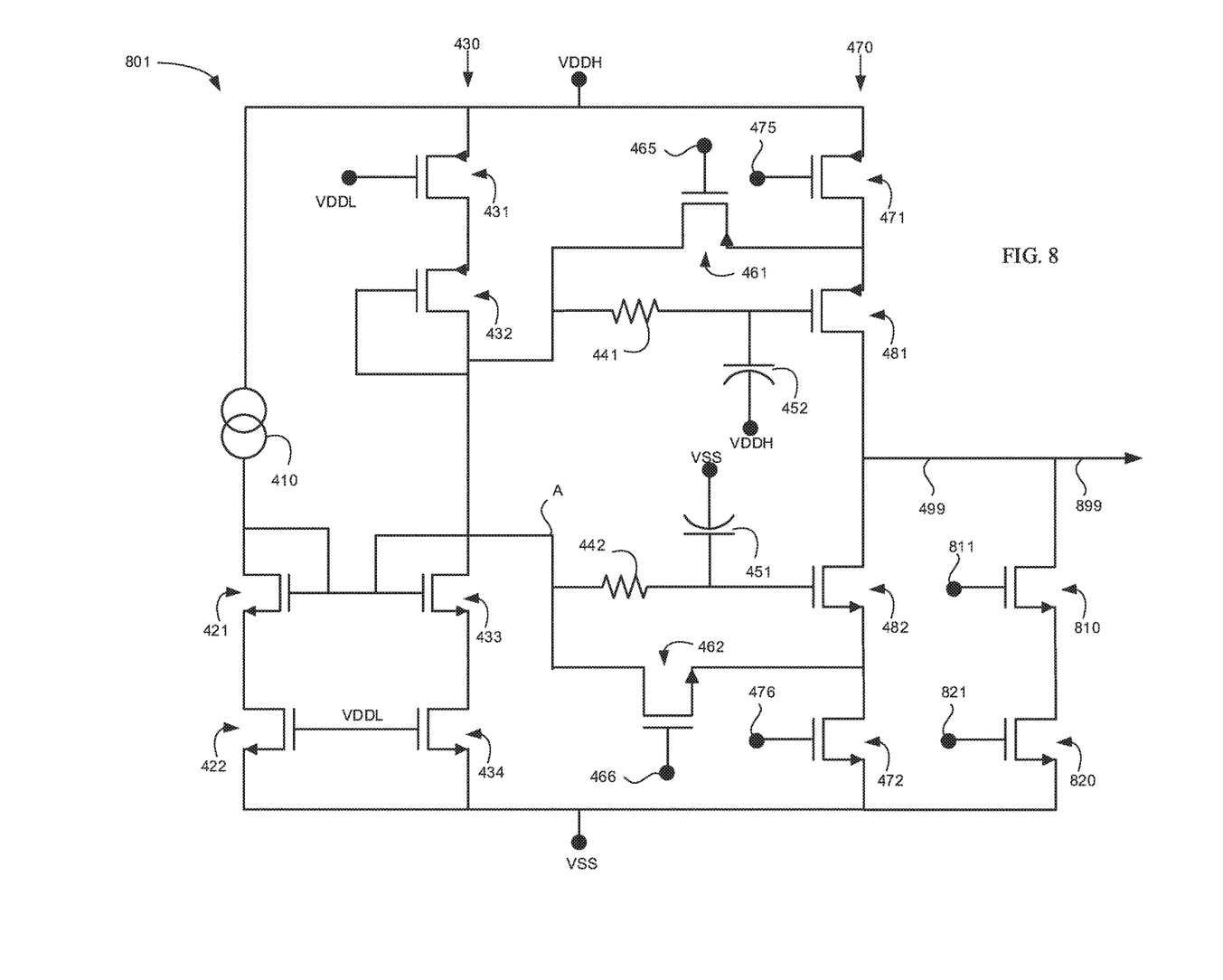
FIG. 8 illustrates the manner in which a phase offset compensator (POC) may be implemented in conjunction with the charge pump.

FIG. 8 illustrates the manner in which the POC 630 may be implemented in conjunction with the charge pump 401. As shown there the elements of the charge pump 401 are retained with reference numerals. The POC part is shown comprising transistors 810 and 820. The transistor 810 is biased to provide $I_{offset}$ when the transistor 820 is turned on. In one embodiment, the transistor 810 is of high voltage rating similar to the transistor 482. The transistor 820 is a low voltage and high speed transistor similar to transistor 472. In one embodiment, the transistor 820 is driven by the switching signal 720. That is terminal 821 is provided with signal 720 so that, the POC part is turned on and the offset current is provided on path 899. The gate terminal 811 may be coupled to the terminal marked A for biasing the transistor 810.

While various examples of the present disclosure have been described above, it should be understood that they have been presented by way of example, and not limitation. Thus, the breadth and scope of the present disclosure should not be limited by any of the above described examples, but should be defined in accordance with the following claims and their equivalents.

What is claimed is:

1. A phase locked loop system comprising:
a phase frequency detector (PFD) providing a shifted UP pulse swinging between a first low voltage and a first high voltage; and
a first charge pump (CP) comprising a set of switching transistors and a set of constant gate bias transistors, in that the set of switching transistors are rated with a first breakdown voltage and a first switching speed, and the set of constant gate bias transistors are rated at a second breakdown voltage and a second switching speed, in that, the first breakdown voltage is substantially half the second breakdown voltage and the first switching speed is greater than the second switching speed,
wherein the PFD is coupled to the CP such that, the shifted UP pulse drives a first switching transistors in the set of switching transistors to provide a high voltage capable signal at an output terminal through a first constant bias transistor, in the set of constant gate bias transistors, that is biased for charge pump.

2. The phase locked loop system of claim 1, wherein the PFD comprising a level shifter shifting an UP pulse to provide the shifted UP pulse, in that the UP pulse swings between a second low voltage to second high voltage wherein the first low voltage is substantially equal to the second high voltage, the first high voltage is substantially equal to twice the second high voltage and second low voltage is substantially zero.

3. The phase locked loop system of claim 2, further comprising a second switching transistor in the set of switching transistors, coupled to the first switching transistor such that the second switching transistor couples a first bias voltage to one of a drain and a source terminal while the other terminal is coupled to a voltage higher than the first breakdown voltage to maintaining corresponding drain to source voltage of the first switching transistor within the first breakdown voltage when the first switching transistor is in OFF state.

4. The phase locked loop system of claim 3, wherein the first switching transistor and the second switching transistors are respectively driven by the shifted UP pulse and its compliment such that the second switching transistor is turned OFF when the first switching transistor is ON and vice-e-versa.

5. The phase locked loop system of claim 4, wherein PFD further comprising a first part operative to provide the UP pulse and inverted UP pulse, is comprising a third set of transistors that are rated with the first breakdown voltage and the first switching speed.

6. The phase locked loop system of claim 4, wherein the PFD comprising a level shifter shifting the inverted UP pulse to the compliment of shifted UP pulse.

7. The phase locked loop system of claim 4, further comprising the PFD providing a DOWN pulse swinging between the second low voltage and the second high voltage and is coupled to the CP such that, the DOWN pulse drives a third switching transistors in the set of switching transistors to provide the high voltage capable signal at the output terminal through a second constant bias transistor, in the set of constant gate bias transistors, that is biased for charge pump.

8. The phase locked loop system of claim 4, further comprising a fourth switching transistor in the set of switching transistors, coupled to the third switching transistor such that the fourth switching transistor couples a second bias voltage to one of a drain and a source terminal while the other terminal is coupled to a source voltage to maintaining corresponding drain to source voltage of the third switching transistor within the first breakdown voltage when the third switching transistor is in OFF state.

9. The phase locked loop system of claim 4, wherein the third switching transistor and the fourth switching transistors are respectively driven by the DOWN pulse and its compliment such that the third switching transistor is turned OFF when the fourth switching transistor is ON and vice-e-versa.

10. The phase locked loop system of claim 4, further comprising a set of charge pumps wherein the PFD is coupled to the set of charge pumps as against to the CP when a loop bandwidth signal is at logic high, such that the shifted UP pulse drives the set of charge pumps to provide the high voltage capable signal with a first charge pump current equal to ($N*Icp$) at the output terminal, in that, N is the number of charge pumps in the set of charge pump and the Icp is the charge pump current of the CP.

11. The phase locked loop system of claim 10, further comprising a phase offset compensator (POC) configured to provide an offset current on the output terminal when the loop bandwidth signal is at logic high.

12. The phase locked loop system of claim 11, wherein each in the first set of charge pumps is similar to the CP.

13. The phase locked loop system of claim 12, wherein the loop bandwidth signal represents a fast downwards frequency sweep and a chirp sweep of a frequency modulated continuous wave radar signal, in that, the loop bandwidth signal is logic high at least during the fast downwards frequency sweep.

* * * * *